United States Patent
Palacios Laloy et al.

(10) Patent No.: US 11,442,119 B2
(45) Date of Patent: Sep. 13, 2022

(54) MAGNETOMETER WITH OPTICAL PUMPING OF A SENSITIVE ELEMENT WITH LINEARLY POLARISED LIGHT AND MULTIPLE-PASS IN THE SENSITIVE ELEMENT

(71) Applicant: COMMISSARIAT À L'ÉNERGIE ATOMIQUE ET AUX ÉNERGIES ALTERNATIVES, Paris (FR)

(72) Inventors: Agustin Palacios Laloy, Grenoble (FR); William Fourcault, Grenoble (FR)

(73) Assignee: COMMISSARIAT À L'ÉNERGIE ATOMIQUE ET AUX ÉNERGIES ALTERNATIVES, Paris (FR)

(*) Notice: Subject to any disclaimer, the term of this patent is extended or adjusted under 35 U.S.C. 154(b) by 0 days.

(21) Appl. No.: 16/723,096

(22) Filed: Dec. 20, 2019

(65) Prior Publication Data
US 2020/0200839 A1 Jun. 25, 2020

(30) Foreign Application Priority Data
Dec. 21, 2018 (FR) .................................... 1873864

(51) Int. Cl.
*G01R 33/032* (2006.01)
(52) U.S. Cl.
CPC ................ *G01R 33/0322* (2013.01)
(58) Field of Classification Search
CPC ........................... G01R 33/0322; G01R 33/26
USPC ..................................................... 324/244.1
See application file for complete search history.

(56) References Cited

U.S. PATENT DOCUMENTS

| | | | | |
|---|---|---|---|---|
| 6,472,869 B1* | 10/2002 | Upschulte | ............. | G01R 33/26 324/300 |
| 8,212,556 B1* | 7/2012 | Schwindt | ............. | G01R 33/26 324/304 |
| 9,116,201 B2* | 8/2015 | Shah | ............. | G01N 24/006 |
| 9,995,800 B1* | 6/2018 | Schwindt | ............. | H03L 7/26 |
| 10,712,407 B2* | 7/2020 | Ben Amar Baranga | ............. | G01R 33/032 |
| 2007/0205767 A1 | 9/2007 | Xu et al. | | |
| 2009/0243610 A1* | 10/2009 | Ichihara | ............. | G01R 33/26 324/304 |

(Continued)

FOREIGN PATENT DOCUMENTS

EP 3364204 A1 8/2018

OTHER PUBLICATIONS

Preliminary French Search Report for French application No. 1873864 dated Oct. 1, 2019.

(Continued)

*Primary Examiner* — Christopher P McAndrew
(74) *Attorney, Agent, or Firm* — Pearne & Gordon LLP

(57) ABSTRACT

An optical pumping magnetometer made with linearly polarised light. The magnetometer comprises a cell filled with an atomic gas and a detector configured to output a signal carrying information about an alignment state of atoms of the atomic gas in the cell. The magnetometer also comprises a collimator arranged to collimate a light beam before it illuminates the cell and a mirror arranged to reflect the collimated light beam after it has passed through the cell such that the collimated light beam makes a multipass through the cell and illuminates the same region of the cell several times.

12 Claims, 3 Drawing Sheets

(56) References Cited

U.S. PATENT DOCUMENTS

| | | | | |
|---|---|---|---|---|
| 2010/0289491 A1* | 11/2010 | Budker | ............... | G01R 33/26 |
| | | | | 324/304 |
| 2011/0025323 A1* | 2/2011 | Budker | ............... | G01R 33/26 |
| | | | | 324/304 |
| 2011/0101974 A1* | 5/2011 | Nagasaka | ......... | G01R 33/0322 |
| | | | | 324/244.1 |
| 2011/0249698 A1* | 10/2011 | Hertwig | ............. | H01S 3/2341 |
| | | | | 359/342 |
| 2011/0310468 A1* | 12/2011 | Hertwig | ............. | H01S 3/2341 |
| | | | | 359/341.1 |
| 2014/0368193 A1* | 12/2014 | Morales | ............. | G01R 33/26 |
| | | | | 324/304 |
| 2015/0070753 A1* | 3/2015 | Knappe | ............. | H01S 3/10015 |
| | | | | 359/340 |
| 2015/0124318 A1* | 5/2015 | Scerbak | ............. | G02F 1/093 |
| | | | | 359/484.04 |
| 2018/0164102 A1 | 6/2018 | Morales et al. | | |
| 2019/0003833 A1 | 1/2019 | Palacios Laloy | | |
| 2019/0074660 A1 | 3/2019 | Beato et al. | | |
| 2019/0107395 A1 | 4/2019 | Palacios Laloy et al. | | |
| 2019/0250223 A1 | 8/2019 | Palacios Laloy | | |
| 2020/0018802 A1 | 1/2020 | Palacios Laloy et al. | | |

OTHER PUBLICATIONS

Specification and drawings for U.S. Appl. No. 16/675,828, entitled "Compact Hanle Effect Magnetometer", filed Nov. 6, 2019.

Beato, Francois et al. "Theory of a 4He parametric-resonance magnetotmeter based on atomic alignment" In: Physical Review, 2018, vol. A, No. 98, pp. 05343-1-053431-10.

Li, s. "Optical rotation in excess of 100 rad generated by Rb vapor in a multipass cell" In: Physical Review, 2011, vol. A, No. 84, pp. 061403-1-061403-4.

* cited by examiner

MAGNETOMETER WITH OPTICAL PUMPING OF A SENSITIVE ELEMENT WITH LINEARLY POLARISED LIGHT AND MULTIPLE-PASS IN THE SENSITIVE ELEMENT

CROSS-REFERENCE TO RELATED APPLICATIONS

This application claims priority from French Patent Application No. 1873864 filed on Dec. 21, 2018. The content of this application is incorporated herein by reference in its entirety.

TECHNICAL FIELD

The field of the invention is the field of optical pumping magnetometers, and more particularly of magnetometers with pumping made with linearly polarised light. The invention can be applied for imagery of biomagnetic fields by means of a network of magnetometers, particularly in magnetoencephalography or magnetoencephalography.

PRIOR ART

Optical pumping magnetometers use an atomic gas confined in a cell, typical metastable helium or alkaline gases, as sensitive elements. These magnetometers that can be in different configurations, can be used to determine the magnetic field making use of the following three processes that take place either sequentially or concomitantly:

1) The use of polarised light sources, typically lasers, provides a means of preparing atomic states characterised by a given orientation or alignment of their spins. This method is called "optical pumping" in the field.

2) These atomic states change under the effect of the magnetic field, particularly under the Zeeman effect, that corresponds to offsets of energy levels as a function of the magnetic field applied to the atoms.

3) The optical properties of the atomic medium are then changed depending on the state of the atoms. Thus for example, an optical measurement can be made, for example an optical absorption measurement, to determine the Zeeman shift and to deduce a measurement of the magnetic field in which the cell is immersed.

A distinction is made between two categories of optical pumping magnetometers depending on the type of pumping being done.

In the most widespread category, optical pumping is done with a pump beam emitting light with circular polarisation and the atomic gas acquires a state said to be oriented characterised by a non-zero average value of its magnetic moment along an axis that is then the propagation axis of the pump beam.

In the other category, pumping is done with a pump beam that emits linearly polarised light and the atomic gas acquires a state said to be aligned, characterised by a zero value of its magnetic moment, but by a non-zero value of a magnitude of type $(3F_z^2-F^2)$ in which F is the total kinetic moment and Fz is the kinetic moment along the polarisation direction of the pump beam.

The atomic states can be characterised (step 3 above) in at least two different ways:

by measuring absorption of the beam used for pumping or of a beam called the "probe" beam tuned to the atomic transition considered and with the same polarisation as the beam used for pumping;

by using a beam called the "probe" beam with linear polarisation and with a wavelength offset from the atomic transition considered. Depending on the type of atomic polarisation (orientation or alignment), the polarisation of this beam is modified (rotation of the polarisation plane in the case of orientation, creation of a circularly polarised component in the case of alignment) that can be measured by separating two of the polarisation states of the beam (the two polarisations at 45° in the case of orientation, the two circular polarisations in the case of alignment) and then photo-detecting them so as to identify the increase in one of the polarisations relative to the other. The term polarimetric measurement is then used.

In both schemas, it often happens that the noise limit of the magnetometer originates from photon noise (also called shot-noise) that is the result of the discrete nature of the photons that are photo-detected. Therefore to improve the noise level of the sensor, it is desirable to increase the impact that atomic properties have on variations of light signals that are photodetected after they have passed in the cell. One way of doing this is to increase the length of the optical path followed by light in the cell containing the atomic gas. However, since the size of the sensor has to be reduced in many applications, this signal gain has to be achieved by another method.

Work has been done at the University of Princeton on magnetometers based on atomic orientation and disclosed particularly in the paper entitled "Optical rotation in excess of 100 rad generated by Rb vapor in a multipass cell" by S. Li et al., Phys. Rev. A 84, 061403 (2011), demonstrated the possibility of obtaining such a gain by means of a multipass cavity in which light from a probe beam passes through the same atomic medium several times. This cavity is a cavity delimited by two off-axis parabolic mirrors, one of which has a small transparent opening at its centre. A slightly divergent light beam is sent through this hole. This beam progressively expands in the cavity, reaches a maximum size and then reconverges until it exits through the same hole. Although this architecture can be used to make a large number of passes and to achieve a very significant gain in the signal-to-noise ratio, the layout of the mirrors is difficult in practice.

Furthermore, since the beam expands progressively, the first propagation trajectory is so narrow that atoms located within its volume make a much more marked contribution to the signal than all the others. Noise levels significantly worse than expected are thus obtained. One solution to solve the problem consists of excluding atoms from the volume of this first propagation trajectory, for example by placing the sensitive element in only a half of the multipass cavity. But in this case, for a constant volume of the sensitive element, it is difficult to reduce the size of the magnetometer.

As described in the paper by F. Beato et al. entitled "Theory of a $^4$He parametric-resonance magnetometer based on atomic alignment", Physical Review A 98, 053431 (2018), magnetometers pumping in linear polarisation have significant advantages over magnetometers pumping in circular polarisation. These advantages are particularly better resolution on some measurement axes and lower sensitivity to undesirable phenomena, particularly the phenomenon known as "light-shift" or "AC-Stark shift" in which circularly polarised light that is not perfectly tuned to an atomic transition behaves like a fictitious magnetic field disturbing the behaviour of atoms. These advantages make these alignment magnetometers particularly interesting for imagery of biomagnetic fields by means of a network of magnetometers, particularly in magnetocardiography or magnetoencephalography.

PRESENTATION OF THE INVENTION

The invention aims to increase the signal level and thus the signal-to-noise ratio, of a magnetometer pumping in linear polarisation. It discloses a magnetometer with optical pumping made by linearly polarised light, comprising a cell filled with an atomic gas and a detector configured to output a signal carrying information about an alignment state of atoms of the atomic gas in the cell. The magnetometer comprises a collimator arranged to collimate a light beam before it illuminates the cell and a mirror arranged to reflect the collimated light beam after it has passed through the cell such that the collimated light beam makes a multipass through the cell and illuminates the same region of the cell several times.

Some preferred but non-limitative aspects of this magnetometer are as follows:
the mirror faces the collimator;
the mirror is arranged on a surface of the cell;
the mirror is a plane mirror;
it comprises a measurement probe that contains a measurement compartment inside which the cell is located and, stacked on the measurement compartment, an optical compartment inside which the collimator is located;
it comprises an optical source that generates the light beam, the optical compartment has an optical input for the light beam and a linear polariser interposed between the optical input and the collimator;
the optical compartment has an optical output for the light beam after the multipass through the cell, the optical output being optically coupled to the detector;
the detector has a photodiode arranged in the optical compartment to photo-detect the light beam after the multipass through the cell;
one or several auxiliary mirrors on which the collimated light beam is incident are located in the optical compartment to participate in the multipass of the collimated light beam through the cell;
a polarisation direction of the light beam is constant during the multipass through the cell. The invention also relates to a magnetometry device, for example a magnetocardiograph or a magnetoencephalograph, that comprises a plurality of magnetometers according to the invention arranged in a network.

BRIEF DESCRIPTION OF THE DRAWINGS

Other aspects, purposes, advantages and characteristics of the invention will be better understood after reading the detailed description given below of preferred embodiments of the invention, given as non-limitative examples, with reference to the appended drawings on which.

DETAILED DESCRIPTION

Figure 1:
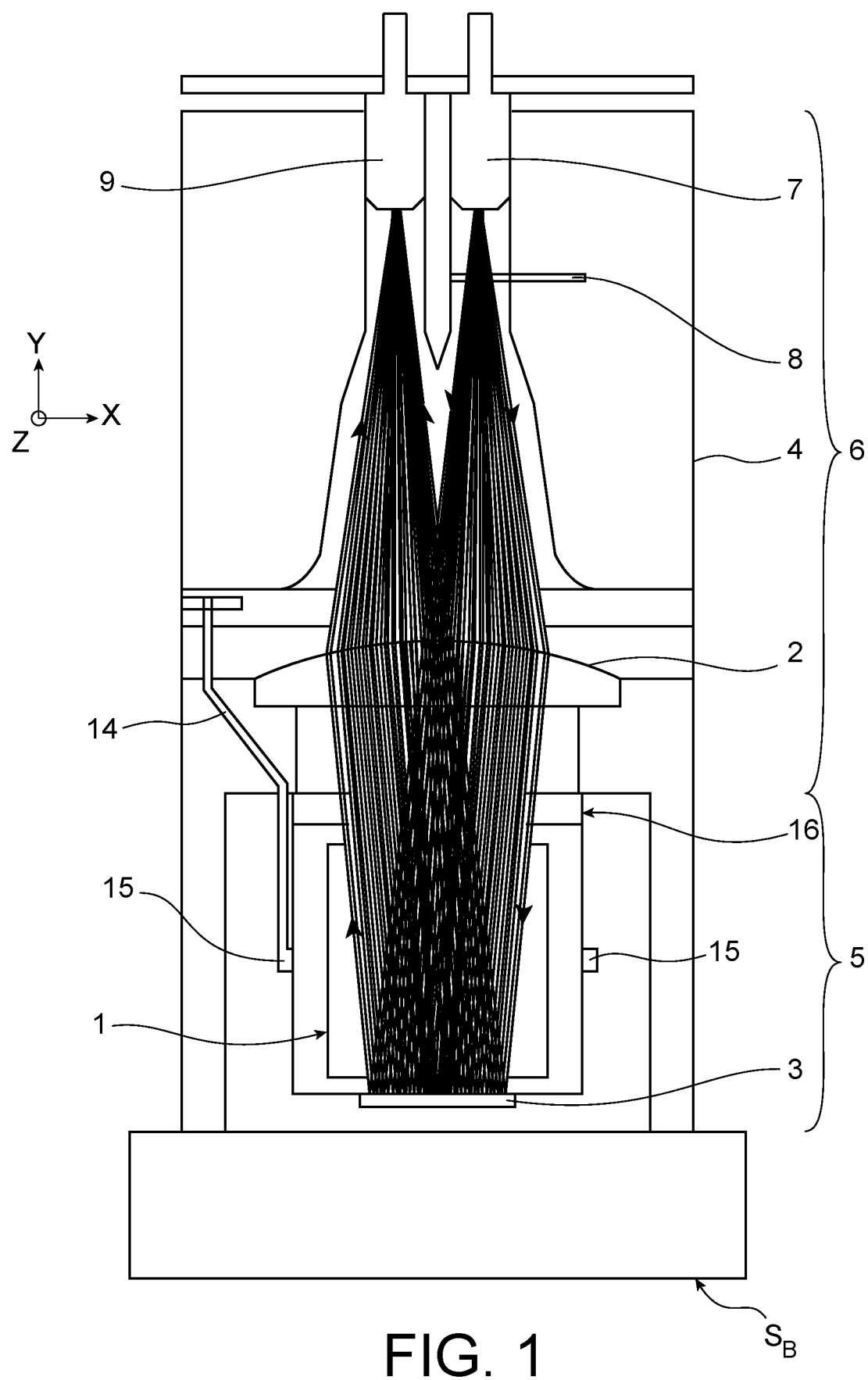
FIG. 1 represents a measurement probe of a magnetometer according to a preferred embodiment of the invention.

The invention relates to a magnetometer with optical pumping made with linearly polarised light. With reference to FIG. 1, the magnetometer comprises a cell 1 filled with an atomic gas that can be polarised in alignment, for example helium-4 or an alkaline gas, and that is subjected to an ambient magnetic field. The magnetometer also comprises an optical source that outputs a light beam that will illuminate the cell and a detector that outputs a signal carrying information about the alignment state of atoms of atomic gas in the cell to an electronic processing unit that uses this signal to output a measurement of the ambient field.

In one preferred embodiment of the invention, the optical beam output by the optical source performs both the role of a pump so that the atoms of atomic gas are subjected to an atomic transition and the role of a probe because its absorption during the crossing through the cell carries information about the state of atoms that in turn contains information about the magnetic field imposed on the atoms.

In the framework of this preferred embodiment, the wavelength of the optical beam is thus tuned to the centre of an atomic transition line, for example the 1083 nm line $D_0$ in the case of helium-4.

In another embodiment of the invention, use is made firstly of a pump beam tuned in wavelength to the centre of an atomic transition line and secondly of the optical beam output by the optical source that in this case is offset in wavelength relative to the atomic transition considered to act as a probe beam. The measurement made is then no longer an absorption measurement but a polarimetric measurement.

In each of these embodiments, pumping and the probing are made with linearly polarised light. A description of the preferred embodiment using a single beam and an absorption measurement is given below with reference to FIG. 1.

The optical source is typically a laser, for example a semiconducting diode. The optical beam output by the optical source is polarised by means of a rectilinear polariser 8 intercalated between the source and the cell 1 or directly integrated into the source. The beam that passes through this cell is thus linearly polarised, which induces atomic states said to be "aligned" in the cell 1, the alignment axis being fixed by the direction of the electric field of the light used for pumping. In the following, a reference coordinate system XYZ is considered in which the Z axis is aligned with the linear polarisation direction of the beam.

In order to increase the level of the signal from the magnetometer in linear polarisation, the invention discloses an increase in the effective interaction length between the sensitive atomic gas located inside the cell and light in the optical beam that is used to measure its alignment state. The invention more particularly discloses the use of a multipass cavity that does not have the disadvantages of the University of Princeton cavity and that is adapted to pumping in linear polarisation. Thus, according to the invention, the magnetometer comprises a collimator 2 arranged to collimate the light beam before it illuminates the cell and a mirror 3 arranged to reflect the collimated light beam after it has passed through the cell such that the collimated light beam makes a multipass through the cell and illuminates the same region of the cell several times.

Since the light beam that makes these forward-return passes is collimated, in other words it has neither convergence nor divergence of more than 5°, it passes through a maximum volume of the cell during each pass. Its section is preferably approximately the same as the section of the cell (for example for a tubular cell with a diameter of 1 cm, the beam section is at least 5 mm) so that a significant proportion of the atomic gas can be probed on each pass, and consequently a significant gain in the signal-to-noise ratio can be made.

These forward-return movements are thus made inside a multipass cavity that, unlike other types of cavity such as Fabry-Perot cavities, is not resonant such that its behaviour is thus largely independent of the wavelength of the light. This is desirable to make the magnetometer robust, for example to slow drifts in the wavelength of the light such as are observed on many commercial lasers.

As is the case in FIG. 1, the mirror 3 can be directly facing the collimator. The mirror 3 can also be arranged on a surface of the cell. The mirror 3 may for example be deposited on the surface of the cell in the form of a stack of thin dielectric layers or a mixed dielectric/metal stack, that can make the mirror and its position perfectly reproducible when the cell is also reproducible, for example because it is made by molecular bonding processes.

The mirror 3 is preferably a plane or quasi-plane mirror (quasi-plane means that the radius of curvature of the mirror is at least 20 times, and preferably at least 100 times, larger than the diameter of the mirror). Such a mirror is in fact thin (for example it is less than 0.5 mm thick) and the atomic gas that forms the sensitive element can then be located as close as possible to the external volume of a measurement compartment in which the cell is located. This is particularly interesting for biological measurements such as those made in magnetoencephalography in which this mirror can be placed practically in contact with the patient's scalp such that the sensitive element is located only a few millimetres from the source of cortical signals to be measured.

As shown on FIG. 1, the cell 1 can effectively be arranged in a measurement compartment 5 of a magnetic field measurement probe 4. The probe 4 also comprises an optical compartment 6 in which the collimator 2 is located, stacked on the measurement compartment. The optical compartment 6 has a section in the ZX plane, the extension of which is similar to the extension of the measurement compartment 5.

The probe 4 is thus parallelepiped in shape, extending along the Y axis and has a top face formed by a top surface of the optical compartment 6 in which there is an optical input 7 for the light beam and a lower face formed by a lower surface of the measurement compartment 5 that will be in contact with the source Sb of the magnetic field to be measured.

When the optical beam output by the optical source is polarised by a rectilinear polariser 8, this rectilinear polariser can be located in the optical compartment 6.

The light beam can be carried from the optical source as far as the optical input 7 by an optic fibre. The upper surface of the optical compartment 6 can also have an optical output 9 for the light beam after its multipass through the cell. The collimator 2 may be used to focus the light beam towards the optical output, this output being optically coupled to the detector, for example by means of an optic fibre. In one variant, the optical output is coincident with the optical input. In another variant, the detector comprises a photodiode arranged in the optical compartment to photo-detect the light beam after its multipass through the cell.

Figure 2:
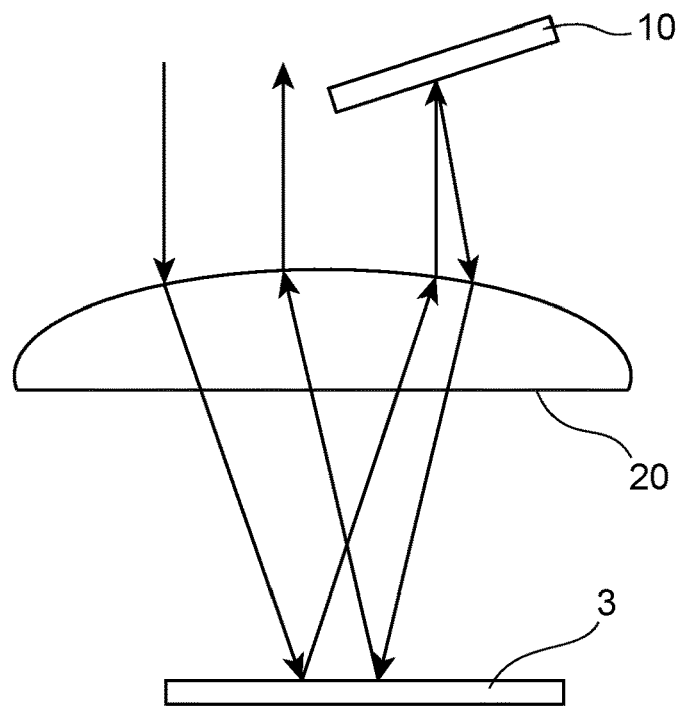
FIG. 2 represents an optical configuration that can be used in the invention to make four passes of the light beam through the cell.
Figure 3:
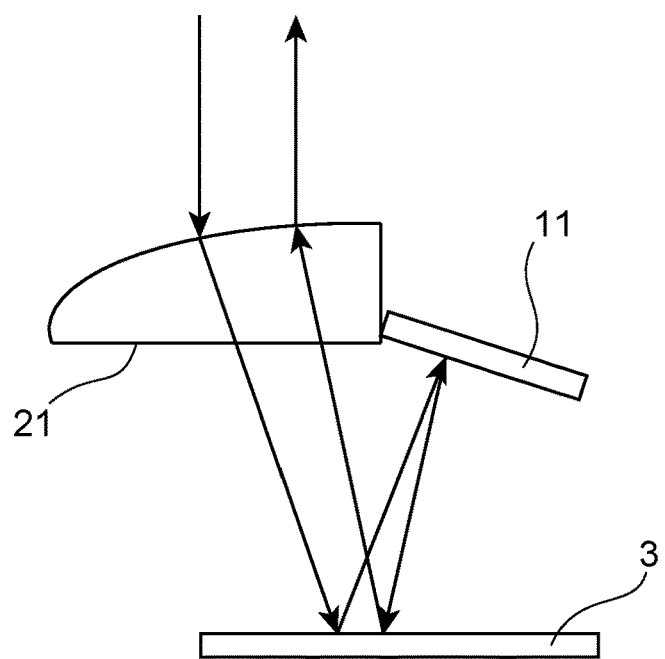
FIG. 3 represents another optical configuration that can be used in the invention to make four passes of the light beam through the cell.
Figure 4:
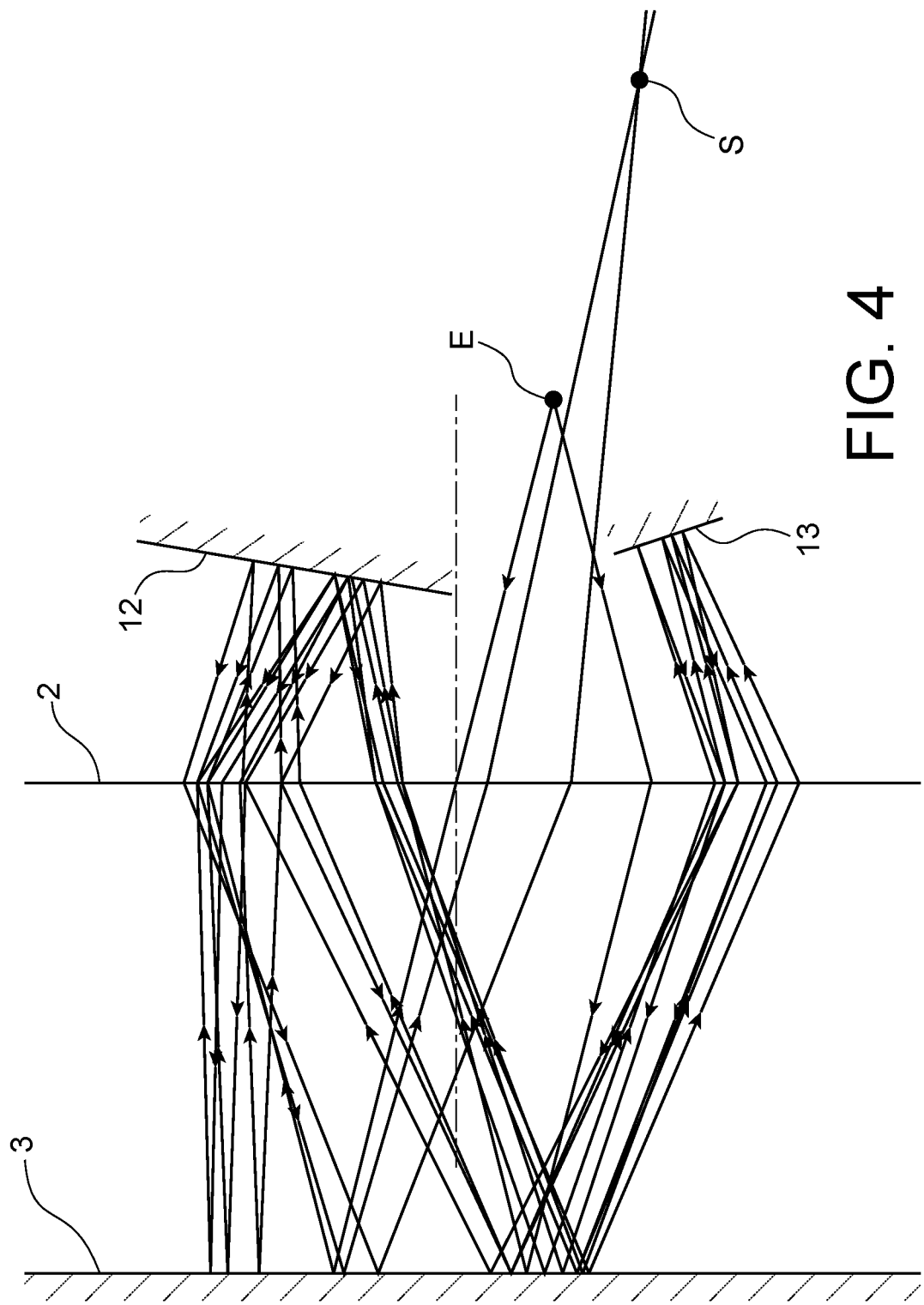
FIG. 4 represents an optical configuration that can be used in the invention to make eight passes of the light beam through the cell.

The optical compartment 6 can also contain different elements that will shape the light beam and reflect it to the mirror 3 at the other end of the cell in the measurement compartment. These elements may include convergent lenses and arrangements of reflecting elements arranged such that light makes a fixed number of forward-return passes in the cell. With reference to FIGS. 2 to 4, these elements may in particular comprise one or several auxiliary mirrors 10-13 on which the collimated light beam is incident and that are located in the optical compartment to participate in the multipass of the collimated light beam through the cell.

The probe 4 can be arranged side-by-side with other similar probes, for example to form a matrix network that can be used to measure the magnetic field with good spatial resolution. This arrangement can be made compact without any loss of space to perform optical functions such as routing of light, or its polarisation or photo-detection. The purpose of each probe is to make a very low noise measurement of the magnetic field on the volume of its sensitive element, so that it is possible to use field source reconstruction processes to derive current sources located close to the probes. For example, these sources may be nerve currents in the brain, currents related to cardiac function, or currents originating from induction by a very low frequency magnetic source in a metallic part to be characterised. In all cases, it is important that the sensitive elements are located as close as possible to the field source, because the source creates magnetic fields that decay with $1/d^3$ where d is the distance to their source. The invention can obtain a very dense assembly of sensitive elements while maintaining a minimum distance between each element and the field sources to be characterised.

To measure the alignment state of atoms pumped with linearly polarised light, either using an absorption measurement or a measurement of the change in ellipticity (change in the proportion between circular polarisations of light), a probe beam is used for which the linear polarisation must ideally always remain in the same plane during its propagation (which is not the case in orientation in which the polarisation plane of light rotates under the effect of its interaction with the atoms). The direction of propagation of the probe beam changes during the reflection(s) made during the multipass, such that the polarisation direction orthogonal to the propagation direction can also change. The result can be a degradation of the signal amplitude, or even undesirable effects such as deformations of magnetic resonance curves potentially causing shifts on measurements output by the magnetometer. Such a change in the polarisation direction would be observed in particular on the University of Princeton cavity to be used in alignment.

Thus in one embodiment of the invention, like that shown in FIG. 1, the multipass is made keeping the polarisation direction of the light beam invariable. The inventors have observed, both in theoretical models and through experimental measurements, that an optimal signal amplitude can be achieved when all light propagation trajectories through the cell are obtained in a single plane, this plane namely the XY plane, being orthogonal to the linear polarisation that therefore does not vary.

In the case in which the sensitive element is helium-4, the magnetometer also comprises a high frequency (HF) discharge system comprising an HF generator that supplies power to two HF discharge electrodes 15 through wires 14, to bring the atoms of atomic gas into an energised state in which they can be subjected to an atomic transition, typically in the metastable state $2^3S_1$.

As a variant, the mirror 3 of the measurement compartment, and possibly also the mirrors of the optical compartment, are used as electrodes to prime the discharge that populates the metastable state $2^3S_1$. It thus because superfluous to add one or even both electrodes 15 around the cell.

In one possible embodiment in which a vector measurement of the magnetic field can be made, the magnetometer also comprises a parametric resonance excitation circuit that comprises a radio frequency generator that outputs to Helmholtz coils with orthogonal axes that, supported by a support 16, surround the cell so as to generate a parametric resonance magnetic excitation field, also called a radio frequency excitation field. Two radiofrequency excitation fields are typically applied to the cell and the directions of these fields, for example along the X and Y axes, determine the principal sensitivity directions of the magnetometer.

The magnetometer may also comprise a closed loop slaving system so that a zero total magnetic field is continuously applied to the cell. The slaving system comprises a regulator coupled to the processing electronics and that injects a current into the Helmholtz coils that surround the cell 1 so as to generate a magnetic compensation field Bc such that the sum $Bc+B_0$ is kept equal to zero at all times. Alternatively, the magnetometer can be operated in open loop, without compensation of the ambient field.

In the example in FIG. 1, the light beam is transported from the laser source in which it is generated to each of the probes through an optic fibre. At the end of this fibre, the beam diverges at an angle related to the digital aperture of the fibre type used. A convergent lens located just below is used to collimate this light and fix its diameter, for example to 6 mm. This collimated light passes through the sensitive element a first time and is then reflected on a plane mirror that reflects it such that it passes a second time through the same region of the sensitive element. In this simple configuration with two passes, once it has exited from the cell, this light once again passes through the convergent lens which has the effect of making it converge inside a second optical fibre that will carry it to a photodetector located outside the probe.

More complex but more advantageous configurations can be made perfectly well as shown on FIGS. 3 and 4 in which light output from the second pass converges on a second mirror 10, 11 arranged such that the beam passes through a third time, and then passes through the cell for the fourth time after another reflection on the mirror 3 of the measurement compartment, before being collected in the return fibre or photodetected directly.

This same principle can be extended to an arbitrary even number of passes, being limited only by the quality of the optics and the volume necessary to place them in the optical compartment of the probe. FIG. 4 represents a software model of an example configuration that, in addition to the collimator 2 and the mirror 3 of the measurement compartment 3, makes use of a second and a third mirror 12, 13 arranged in the optical compartment to make eight passes through the cell from an input point E to an output point S.

The invention claimed is:

1. A magnetometer, comprising:
 a cell filled with an atomic gas optically pumped by linearly polarised light,
 a detector configured to output a signal carrying information about an alignment state of atoms of the atomic gas in the cell,
 a collimator arranged to collimate a light beam before it illuminates the cell, and
 a mirror arranged to reflect the collimated light beam after it has passed through the cell such that the collimated light beam makes a multipass through the cell and illuminates the same region of the cell several times,
 wherein the signal carrying information about an alignment state of atoms of the atomic gas in the cell is obtained by a measure of an absorption of the collimated light beam by the atomic gas after the multipass through the cell.

2. The magnetometer according to claim 1, wherein the mirror faces the collimator.

3. The magnetometer according to claim 1, wherein the mirror is arranged on a surface of the cell.

4. The magnetometer according to claim 1, wherein the mirror is a plane mirror.

5. The magnetometer according to claim 1, comprising a measurement probe that contains a measurement compartment inside which the cell is located and, stacked on the measurement compartment, an optical compartment inside which the collimator is located.

6. The magnetometer according to claim 5, comprising an optical source that generates the light beam, wherein the optical compartment has an optical input for the light beam and a linear polariser interposed between the optical input and the collimator.

7. The magnetometer according to claim 5, wherein the optical compartment has an optical output for the light beam after it has made the multipass through the cell, the optical output being optically coupled to the detector.

8. The magnetometer according to claim 5, wherein the detector comprises a photodiode arranged in the optical compartment to photo-detect the light beam after it has made the multipass through the cell.

9. The magnetometer according to claim 5, wherein one or several auxiliary mirrors on which the collimated light beam is incident are located in the optical compartment and participate in the multipass of the collimated light beam through the cell.

10. The magnetometer according to claim 1, wherein a polarisation direction of the light beam is constant during the multipass of the collimated light beam through the cell.

11. The magnetometry device comprising a plurality of magnetometers according to claim 1 arranged in a network.

12. A magnetometer, comprising:
 a cell filled with an atomic gas optically pumped by linearly polarized light,
 a detector configured to output a signal carrying information about an alignment state of atoms of the atomic gas in the cell,
 a collimator arranged to collimate a light beam before it illuminates the cell, and
 a mirror arranged to reflect the collimated light beam after it has passed through the cell such that the collimated light beam makes a multipass through the cell and illuminates the same region of the cell several times,
 wherein the signal carrying information about an alignment state of atoms of the atomic gas in the cell is obtained by a polarimetric measurement of the collimated light beam after the multipass through the cell.

* * * * *